(12) United States Patent
Schaule et al.

(10) Patent No.: US 7,633,304 B2
(45) Date of Patent: Dec. 15, 2009

(54) DEVICE FOR TESTING ELECTRONIC COMPONENTS, IN PARTICULAR ICS, HAVING A SEALING BOARD ARRANGED INSIDE A PRESSURE TEST CHAMBER

(75) Inventors: Max Schaule, Mindelheim (DE); Andreas Nagy, München (DE); Stefan Kurz, Rosenheim (DE)

(73) Assignee: Multitest elektronische Systeme GmbH, Rosenheim (DE)

( * ) Notice: Subject to any disclaimer, the term of this patent is extended or adjusted under 35 U.S.C. 154(b) by 0 days.

(21) Appl. No.: 12/169,899

(22) Filed: Jul. 9, 2008

(65) Prior Publication Data
US 2009/0015277 A1 Jan. 15, 2009

(30) Foreign Application Priority Data
Jul. 12, 2007 (DE) ............ 10 2007 032 557

(51) Int. Cl.
*G01R 31/02* (2006.01)
(52) U.S. Cl. .................. 324/754; 324/158.1
(58) Field of Classification Search ......... 324/754–765, 324/158.1; 73/700
See application file for complete search history.

(56) References Cited

U.S. PATENT DOCUMENTS

| 3,016,489 | A | * | 1/1962 | Briggs et al. | ........ 324/754 |
| 4,777,716 | A | * | 10/1988 | Folk et al. | .......... 29/593 |
| 5,336,992 | A | * | 8/1994 | Saito et al. | ........ 324/754 |
| 5,479,109 | A | * | 12/1995 | Lau et al. | ......... 324/758 |
| 6,072,325 | A | | 6/2000 | Sano | |
| 6,812,718 | B1 | | 11/2004 | Chong et al. | |
| 2006/0119377 | A1 | * | 6/2006 | Chong et al. | ........ 324/764 |
| 2008/0036480 | A1 | * | 2/2008 | Hobbs et al. | ........ 324/754 |

FOREIGN PATENT DOCUMENTS

| DE | 196 54 404 | | 6/1998 |
| EP | 1011134 | A1 | 6/2000 |
| EP | 1186903 | A2 | 3/2002 |
| EP | 1596429 | A1 | 11/2005 |
| GB | 2285348 | A | 7/1995 |
| WO | WO0113130 | A1 | 2/2001 |

OTHER PUBLICATIONS

European Search Report issued in corresponding EP application No. EP08011535 (Aug. 28, 2008).

* cited by examiner

*Primary Examiner*—Ha Tran T Nguyen
*Assistant Examiner*—Richard Isla Rodas
(74) *Attorney, Agent, or Firm*—Nixon & Vanderhye P.C.

(57) ABSTRACT

A device for testing electronic components such as integrated circuit ICs, under particular pressure conditions, has a pressure test chamber with contact elements which on the one hand are connected to an electronic testing device and on the other hand extend into a cavity of the pressure test chamber. Arranged inside the cavity of the pressure test chamber, there is and air-fight sealing board which extends transversely over the contact elements and is sealed peripherally from an assigned pressure chamber half. By means of the sealing board, first contact element sections are separated air-tightly from second contact element sections but are in electrically conductive connection.

4 Claims, 4 Drawing Sheets

Figure 1:
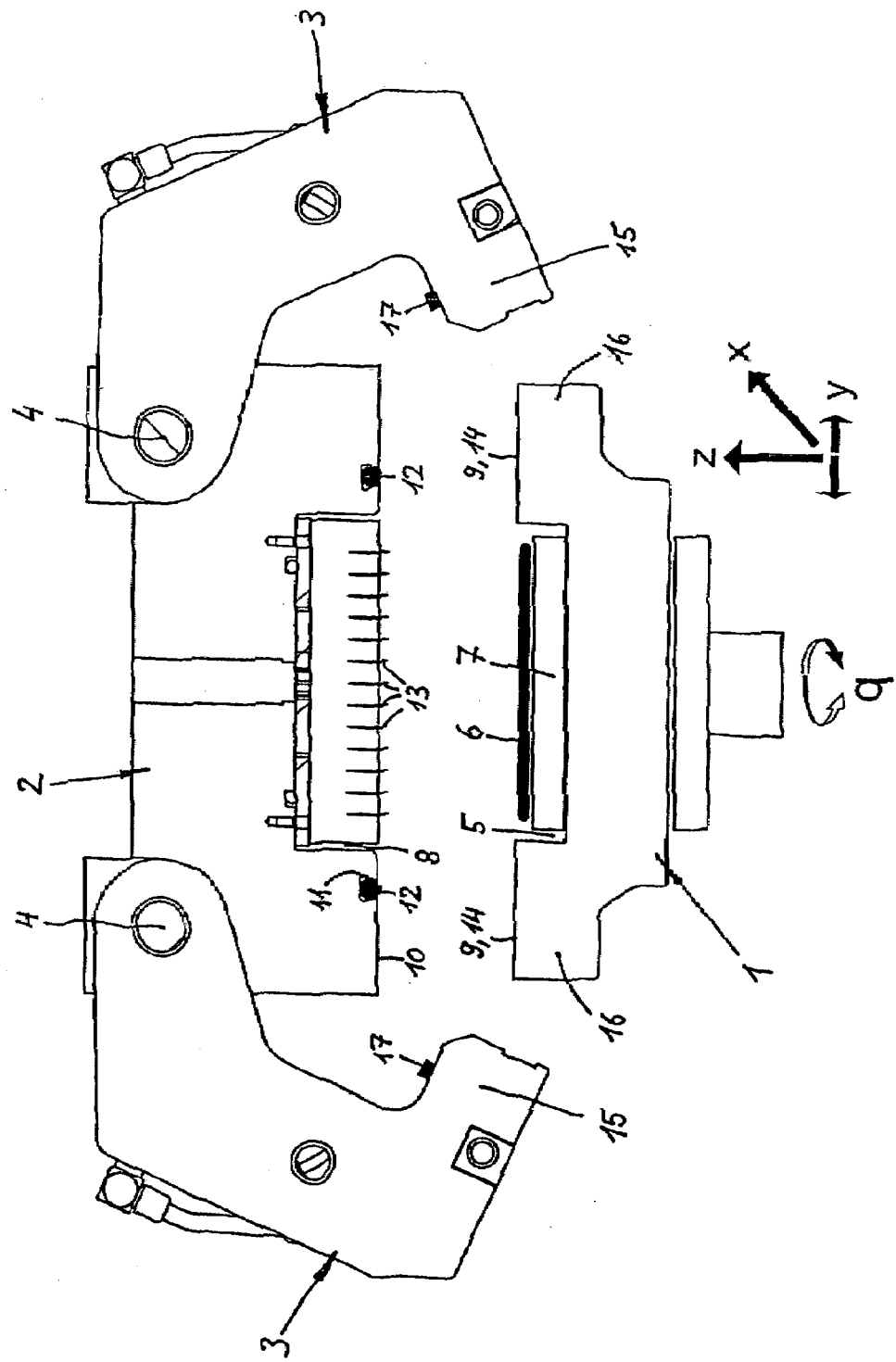

DEVICE FOR TESTING ELECTRONIC COMPONENTS, IN PARTICULAR ICS, HAVING A SEALING BOARD ARRANGED INSIDE A PRESSURE TEST CHAMBER

The invention relates to a device for testing electronic components, in particular ICs, under particular pressure conditions according to the pre-characterizing clause of Claim 1.

Electronic components, for example MEMS (micro-electromechanical systems), which are used to measure pressure, are conventionally subjected to a pressure test after their production in order to check that they function properly or to compensate for their functional characteristic curve at different temperatures, i.e. to calibrate them. To this end, it is sometimes necessary to determine several hundred parameters. The pressure tests are carried out in pressure test chambers, which consist of two pressure chamber halves that can be separated from one another. The components to be tested are placed into one of the two pressure chamber halves, then this pressure chamber half is applied against the other pressure chamber half until it bears tightly on this other pressure chamber half. In this process, contacts of the components are connected to contact elements, which project into the cavity of the pressure test chamber and lead to an electronic testing instrument. The pressure with which the tests are intended to be carried out is subsequently produced in the cavity of the pressure test chamber. After the end of the test, the pressure chamber halves are moved apart from one another again so that the components can be removed and sorted according to the test result. The introduction of the components into the cavity and the removal of the components from the cavity are expediently carried out by means of a handler, i.e. a handling machine, which loads and unloads the components at high speed.

It is known to simultaneously test a plurality of components arranged next to one another, so that the testing of the components can be substantially accelerated. For example, a plurality of separated components may be placed into special trays and the pressure test chamber may be loaded with the entire tray. Also known are electronic components which are provided in the form of a strip-shaped assembly (strip) before they are separated from one another. It is known to place such strips into the pressure test chamber and test all the components of the strip simultaneously.

In pressure tests, it is essential that the desired test pressure can be set up as rapidly as possible inside the cavity of the pressure test chamber and kept constant during the test. It is therefore necessary for the cavity to be reliably sealed from the outside. The sealing must often also be able to withstand test pressures of for example 20 bar or more. The pressure test chambers should furthermore be constructed so that they can be refitted in the simplest possible way for different components.

It is an object of the invention to provide a device for testing electronic components, in particular ICs, under particular pressure conditions, which is constructed as simply as possible and can be adapted in a simple and inexpensive way to different components, and which sustains the desired pressure conditions in a reliable way.

This object is achieved according to the invention by a device having the features of Claim 1. Advantageous embodiments of the invention are described in the other claims.

According to the invention, each contact element is subdivided into a first contact element section passing through the pressure chamber halves and a second contact element section, which is distanced from the first contact element section and is arranged inside the cavity. An air-tight sealing board is arranged inside the cavity and extends transversely over the contact elements and is sealed peripherally from the assigned pressure chamber half, the first contact element sections being arranged on one side of the sealing board and the second contact element sections, assigned to the first contact element sections, being arranged on the opposite side of the sealing board. Furthermore, the first contact element sections are electrically connected to the opposite second contact element sections via conductive sections of the sealing board.

With the device according to the invention, it is therefore not necessary for the first contact element sections, which pass through the pressure chamber and extend out from the cavity, to be sealed individually. Instead, all the first contact element sections together are sealed by the sealing board. On the opposite side of the sealing board, the second contact element sections are then fastened which—separated by the sealing board—already lie in the region of the cavity-where the desired test pressure is set up.

According to a particularly advantageous embodiment, a component-specific DUT board is provided which is arranged inside the cavity between the second contact element sections and third contact element sections, which are distanced from the second contact element sections, and with which the contacts of the components can be brought in contact. Such an embodiment allows particularly simple conversion of the device for different components and strip geometries. The number of parts to be changed for the conversion is greatly reduced. It is particularly advantageous in this case that the sealing board can remain the same even with different components and strip geometries and—since the component-specific adaptation is already carried out by the DUT board arranged inside the cavity—the instruments connected to the contact elements outside the pressure test chamber may also remain the same, for example an interface board and/or a DIB board (data input bus board). In this way, the conversion costs and the conversion time can be reduced.

As an alternative to this, it is also possible for a component-specific DUT board to be provided which is arranged outside the pressure test chamber and is in contact with the first contact element sections, whereas the second contact element sections are adapted to and lie opposite to the contacts of the components to be tested so that the contacts of the components can be brought in contact with the second contact element sections.

According to an advantageous embodiment, at least the first contact element sections consist of contact pins (pogo pins) which are resilient in their longitudinal direction. It is advantageous for the second contact element sections as well, and optionally also the third contact element sections, to consist of such resilient contact pins. As an alternative to this, however, it is also conceivable for those contact element sections with which the components can be brought in contact to be designed differently, for example having the form of curved contact pins.

Figure 2:
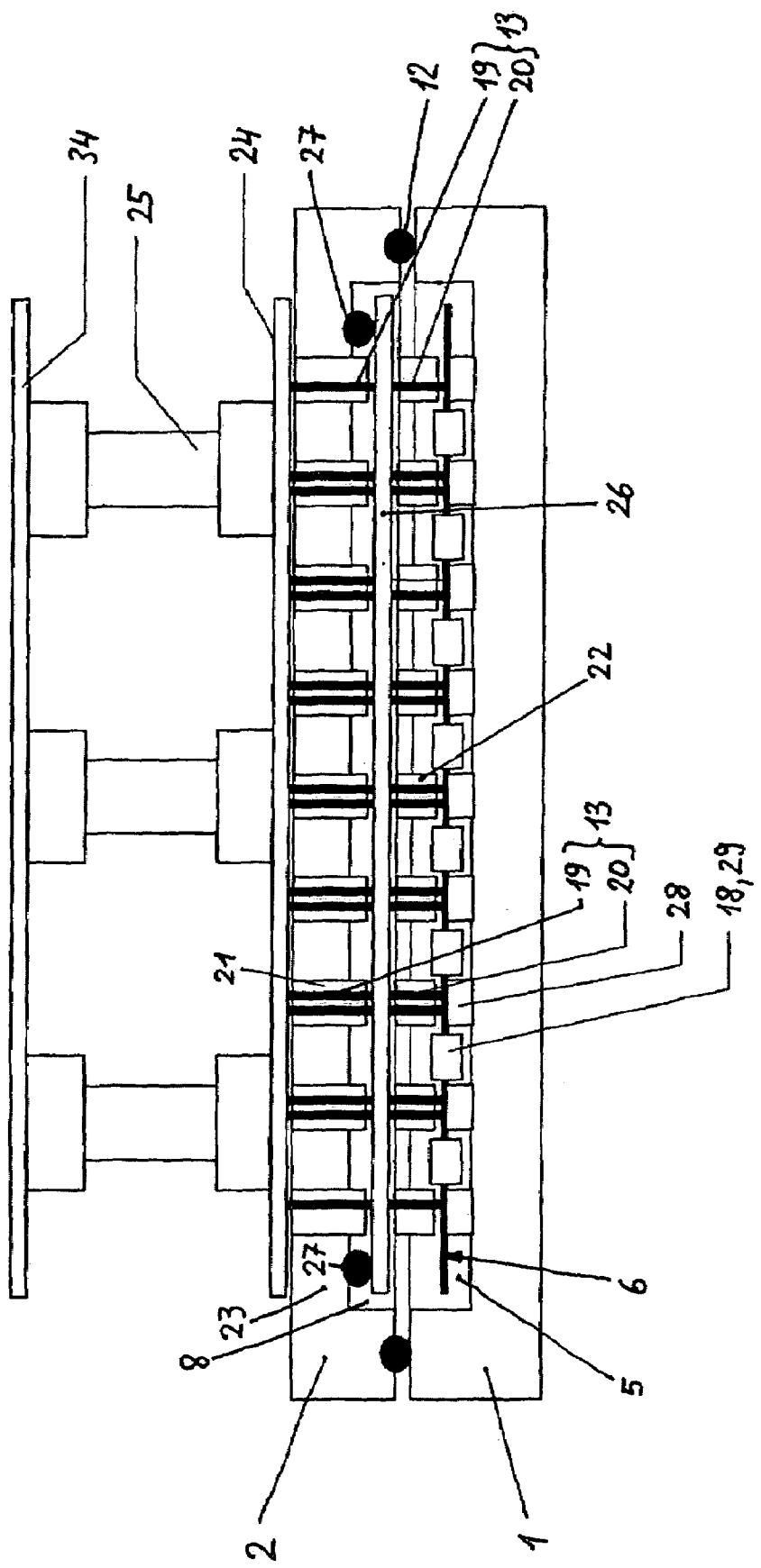
Figure 3:
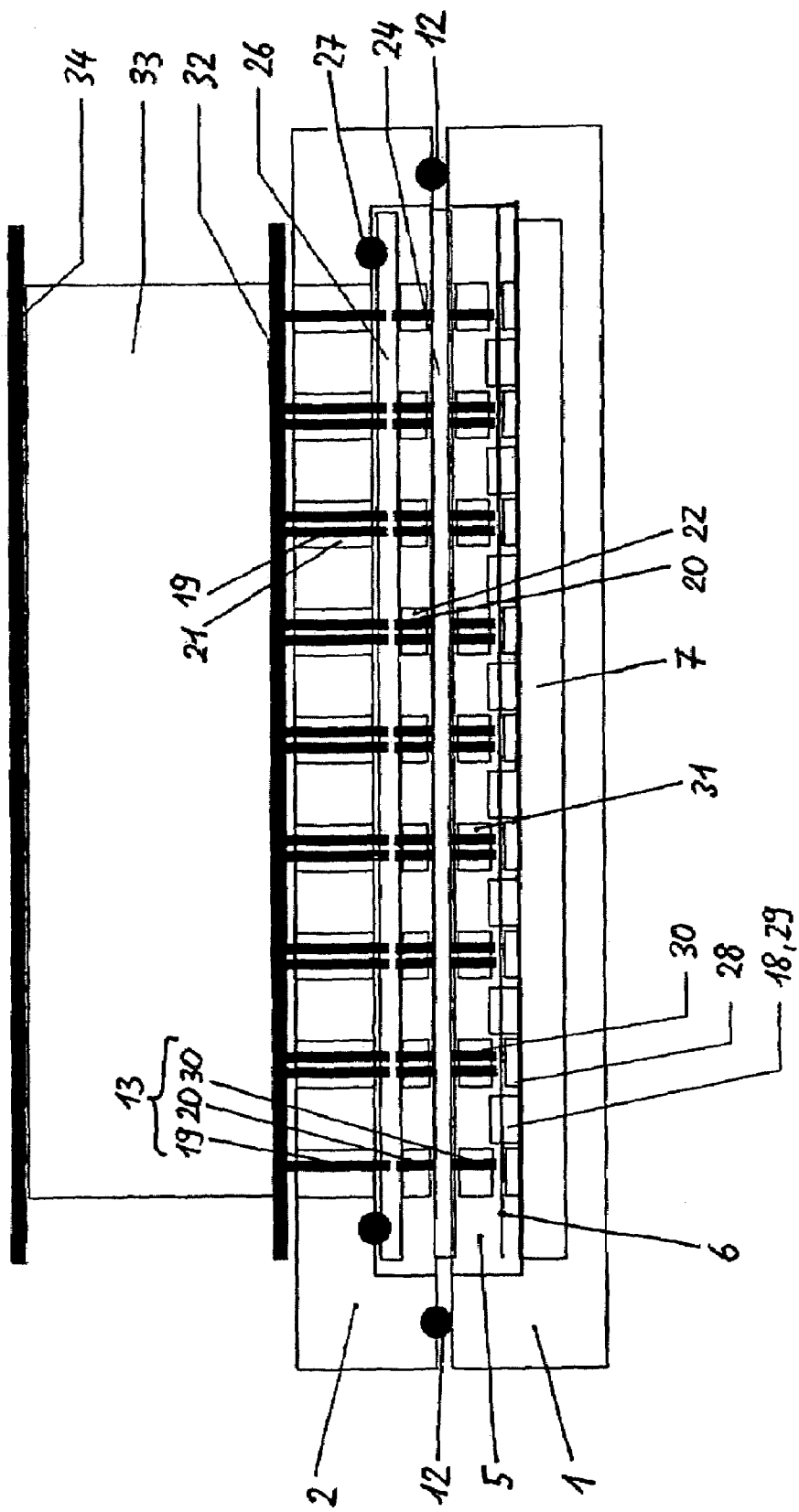
Figure 4:
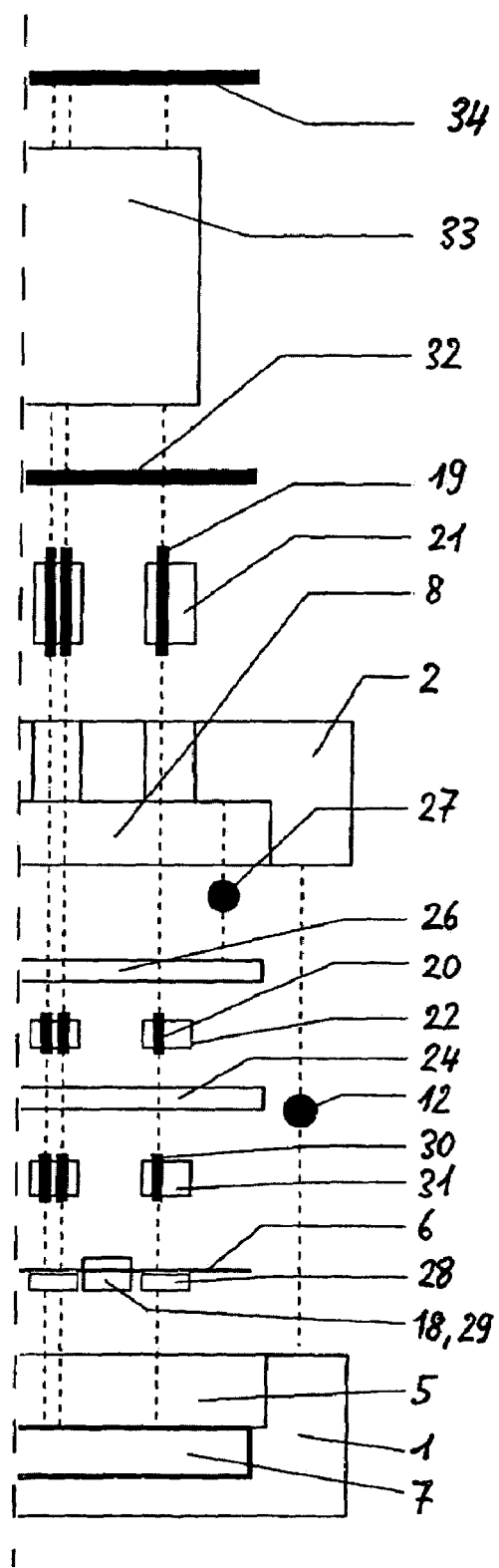

The invention will be explained in more detail below with the aid of drawings, in which:

FIG. 1 shows a schematic vertical section through a pressure test chamber such as may be used according to the invention, in order to illustrate the basic functionality of the pressure test chamber, FIG. 2 shows a schematic longitudinal section through a first embodiment of the device according to the invention, FIG. 3 shows a schematic longitudinal section through a second embodiment of the device according to the invention and FIG. 4 shows an exploded view of essential parts of the edge region of the device in FIG. 3.

FIG. 1 shows a pressure test chamber with a first, lower pressure chamber half 1 and a second, upper pressure chamber half 2. In the exemplary embodiment shown, the upper pressure chamber half 2 is arranged statically, whereas the lower pressure chamber half 1 can be raised and lowered in the vertical direction, i.e. in the z direction, by means of a lifting device (not shown).

FIG. 1 furthermore shows a closure mechanism comprising two tilting jaws 3. The tilting jaws 3 can be tilted about tilt axes 4 between an open position shown in FIG. 1 and a closed position shown in FIGS. 2 and 3. The two tilt axes 4 extend mutually parallel and may either—as represented in FIG. 1—be mounted on the upper pressure chamber half 2 or, alternatively, even above the upper pressure chamber half 2.

The two pressure chamber halves 1, 2 have at least essentially a rectangular shape in plan view. The lower pressure chamber half 1 has a recess 5, into which a plurality of components 18 arranged next to one another (FIGS. 2 to 4) can be inserted when the lower pressure chamber half 1 is at a sufficient distance from the upper pressure chamber half 3. In the exemplary embodiment represented, the components 18 lie next to one another in the form of an assembly, which is designed as a rectangular strip 6. Each strip 6 may have a multiplicity of components 18 both in the longitudinal and in the transverse direction, which are arranged matricially in the x-y plane.

The strip 6 may rest on a strip tray 7 (FIGS. 1 and 3) and be placed together with the strip tray 7 into the recess 5 of the lower pressure chamber half 1. It is also possible to place the strip 6 into the recess 5 without the strip tray 7, if the lower pressure chamber half 1 itself has a corresponding instrument for carrying the strip 6.

The upper pressure chamber half 2 has a recess 8 which lies opposite the recess 5 of the lower pressure chamber half 1 and, together therewith, forms a closed cavity when the lower pressure chamber half 1 is applied onto the upper pressure chamber half 2.

The pressure chamber halves 1, 2 have mutually opposing surfaces 9, 10, which, are mutually parallel and flatly designed. In the surface 10 of the upper pressure chamber half 2, a groove 11 is provided which extends around the recess 8 and into which a seal 12 in the form of an O-ring is embedded. The seal 12 projects downwards beyond the surface 10, so that the surface 9 of the lower pressure chamber half 1 can be pressed against the seal 12, as a result of which the cavity is sealed pressure-tightly when the pressure chamber halves 1, 2 are brought together.

Contact elements 13 project from the upper pressure chamber half 2 into the cavity and they can be brought in contact with corresponding contacts of the components 18 placed into the recess 5 when the two pressure chamber halves 1, 2 are brought together. As will be explained in more detail below with the aid of FIGS. 2 to 4, the contact elements 13 extend through the upper pressure chamber half 2 into the outer region of the pressure test chamber and are connected to an electronic testing device (not shown), expediently via a test head.

As is furthermore represented in FIG. 1, the two tilting jaws 3 have a C- or U-shaped design and respectively comprise a supporting section 15 pointing inwards which, when the pressure chamber halves 1, 2 are brought together, engages underneath an edge section 16 of the lower pressure chamber half 1 after the tilt axes 3 have been tilted together. Each tilting jaw 3 furthermore has at least one lifting device (not shown in detail) which comprises a pneumatic cylinder, which is arranged in the tilting jaw 3 and acts on a piston 17 via a lifting mechanism. The piston 17 is mounted longitudinally displaceably in the supporting section 15 and can be deployed from an essentially retracted position which is represented in FIG. 1, downwards over the supporting section 15 by means of the plunger, so that the lower pressure chamber half 1 is pressed firmly against the upper pressure chamber half 2 or against its seal 12 when the tilting jaws 3 are closed, as a result of which the cavity is sealed.

The tilting jaws 3 furthermore may have a mechanical locking instrument (not shown) with which spacer plates can be inserted into the gap between the supporting sections 15 and the edge sections 16 of the lower pressure chamber half 1, after the piston 17 has pressed the lower pressure chamber half 1 against the seal 12 of the upper pressure chamber half 2. In this way, the tight application of the lower pressure chamber half 1 on the upper pressure chamber half 2 can be sustained mechanically, so that the lifting devices can be released.

In order to test the components 18, firstly a strip 6, optionally together with a strip tray 7 onto which the strip 6 has previously been placed, is placed into the recess 5 of the lower pressure chamber half 1. The position of the strip 6 relative to the lower pressure chamber half 1 and the position of the lower pressure chamber half 1 relative to the upper pressure chamber half 2 are subsequently determined (by means of a known method).

The lower pressure chamber half 1 is raised in the z direction by means of the lifting device (not shown) into the immediate vicinity of the upper pressure chamber half, the lower pressure chamber half 1 being positioned in an accurate test position relative to the upper pressure chamber half 2.

The two tilting jaws 3 are subsequently tilted inwards, with the supporting sections 15 engaging underneath the edge sections 16 of the lower pressure chamber half 1. In this position, the pistons 17 are deployed upwards so that the lower pressure chamber half 1 is pressed against the seal of the upper chamber half 2 and this seal 12 is elastically deformed accordingly. The spacer plates (not shown) are subsequently moved into the gap between the supporting sections 15 of the tilting jaws 3 and the lower pressure chamber half 1 by means of the mechanical locking instrument. The pistons 17 may now be retracted, the tight bearing of the lower pressure chamber half 1 on the seal 12 being sustained. In this position, the contacts of the components 18 are contacted by the contact elements 13 of the upper pressure chamber half 2.

The desired test pressure is subsequently set up in the cavity. Once this test pressure has been reached, the electronic measurement of the components 18 is carried out.

At the end of the measurement, the pressure in the cavity is reduced. The pistons 17 are briefly deployed in order to be able to retract the spacer plates. The pistons 17 are then retracted into the supporting sections 15. The tilting jaws 3 can now be tilted back up into the open position shown in FIG. 1, then the lower pressure chamber half 1 is moved downwards away from the upper pressure chamber half so that the tested components 18, optionally with the strip tray 7, can be removed from the lower pressure chamber half 1. The pressure test chamber can thus be reloaded with new components 18.

The lower pressure chamber half 1 can be displaced relative to the upper pressure chamber half 2 in the x and/or y direction and/or rotated about the z axis, so that the number of contact elements 13 may be less than the number of contacts of the components 18 placed in the cavity. In this case, only a part of the components 18 which have been introduced is initially contacted and tested, then the lower pressure chamber half 1 is displaced and/or rotated and another part of the components 18 which have been introduced is subsequently contacted and tested. This process is repeated until all the introduced components 18 have been contacted and tested. Only then is the pressure chamber half 1 lowered so that the tested components 18 can be removed and new components 18 can be introduced. This type of step by step testing with lateral displacement and/or rotation of the lower pressure chamber half 1 is, however, only optional in the scope of the present invention.

A first embodiment of the device according to the invention will be explained in more detail below with the aid of FIG. 2. In this embodiment, each contact element 13 consists of a first contact element section 19 and a second contact element section 20 which is distanced therefrom and is expediently collinear. In the exemplary embodiment represented, the contact element sections 19, 20 respectively consist of resilient contact pins (pogo pins); a multiplicity of neighboring contact pins may be bundled together in the form of so-called pogo stacks 21, 22. The first contact element sections 19 or pogo stacks 21 pass through the upper wall 23 of the upper pressure chamber half 2. The outer ends of the first contact element sections 19 are in electrical contact with assigned contacts of a DUT board 24 (device under test board), which is arranged above the upper pressure chamber half 2 and therefore outside the pressure test chamber. The DUT board 24 is an exchangeable component-specific printed circuit board. The DUT board 24 is in connection via electrical connecting elements 25 with a DIB (data input bus board), through which an electrical connection to the electronic testing device (not shown) is provided.

The inner ends of the first contact element sections 19, which extend slightly inwards beyond the lower side of the upper wall 23, are in contact with assigned contacts on the upper side of a sealing board 26. The sealing board 26 is designed as an air-tight plate or printed circuit board, which extends transversely to the longitudinal extent of the contact elements 13 over all the contact elements 13 and spatially separates the first contact element sections 19 from the second contact element sections 20. The sealing board 26 is fastened on the wall 23 of the upper pressure chamber half 2 and is sealed air-tightly against the wall 23 in its edge region by means of a circumferential seal 27. The sealing board 26 therefore prevents air or another gas from the cavity region, in which the test pressure is set up (by means of lines which are not shown) from being able to travel outwards (or inwards), through the openings in the wall 23 in which the first contact element sections 19 or pogo stacks 21 are arranged.

On its lower side, the sealing board 26 has electrical contacts which correspond to the contacts on its upper side and are electrically connected thereto. On these lower-side contacts, the upper ends of the second contact element sections 20 bear so that they are electrically connected to the respectively assigned first contact element sections 19.

The second contact element sections 20 or pogo stacks 22 are expediently located in contact sockets, which are fastened on the sealing board 26 from below. The lower ends of the second contact element sections 20 are in this case arranged according to the contacts of the components 18 to be tested, so that the component contacts can be contacted by the second contact element sections 20 when the lower pressure chamber half 1 bears tightly against the upper pressure chamber half 2. The seal 12 prevents air between the pressure chamber halves 1, 2 from being able to travel outwards from the cavity, or conversely from the outside into the cavity, as was described with the aid of FIG. 1.

In the exemplary embodiment of FIG. 2, the strip 6 is placed on a multiplicity of support elements 28 (lead backers), which are located at the bottom of the recess 5 and support the strip 6 in the region of the component contacts. The component body 29 is arranged between support elements 28.

A second embodiment of the device according to the invention will be described in more detail below with the aid of FIGS. 3 and 4. This second embodiment differs from the first embodiment described above essentially in that the DUT board 24 is arranged not outside but inside the cavity of the pressure test chamber and is located between the sealing board 26 and the components 18 to be tested. The two pressure chamber halves 1, 2, their mutual sealing by means of the seal 12, the first contact element sections 19 or pogo stacks 21 and their sealing by means of the sealing board 26, as well as the seal 27, are designed and arranged identically or very similarly as in the first embodiment, so that reference may be made to the first embodiment in this regard.

As may be seen from FIGS. 3 and 4, the DUT board 24 is arranged parallel to the sealing board 26, i.e. horizontally in the present exemplary embodiment, between the lower ends of the second contact element sections 20 and assigned third contact element sections 30. The third contact element sections 30 in turn consist of resilient contact pins (pogo pins) which are arranged according to the contacts of the components 18 to be contacted, so that the component contacts can be contacted by the third contact element sections 30 when the lower pressure chamber half 1 is pressed so as to bear tightly against the upper pressure chamber half 2.

The third contact element sections 30 may in turn be bundled together in the form of pogo stacks 31 and they are fastened on the lower side of the DUT board 24 by means of contact sockets.

In this embodiment, the exchangeable component-specific DUT board 24 is used to contact the third contact element sections 30 through to the second contact element sections 20 and thereby to contact the third contact element sections 30, arranged and designed to be component specific, to the associated second contact element sections 20, which do not need to be arranged and/or designed to be component specific. This second embodiment therefore offers the advantage that, when changing the component types to be tested, only the DUT board 24 and the third contact element sections 30 on the side of the upper pressure chamber half 2 need to be exchanged, whereas the components arranged above the DUT board 24 are universally applicable i.e. suitable for different component types.

In the region of the component contacts, the strip 6 rests on support elements 28 (lead backers) which are arranged on a strip tray 7 which can be inserted into the recess 5.

The upper ends of the first contact element sections 19 are in contact with a universal interface board 32, which is arranged above the upper pressure chamber half 2 and therefore outside the pressure test chamber. This interface board 32 is in turn in contact via a universal through-board with a DIB board 34 (data input bus board). The interface board, through-board 33 and DIB board 34 are therefore equally suitable for testing different component types.

The invention claimed is:

1. A device for testing electronic components, in particular ICs, under particular pressure conditions, comprising:
    a dividable pressure test chamber having two pressure chamber halves which can be separated from one another and brought together, and which can be brought into a contact position in which they tightly enclose a cavity,
    the pressure test chamber comprising contact elements which extend into the cavity so that contacts of components to be tested, which are arranged in the cavity, can be brought in contact with assigned contact elements, the contact elements extending through one of the pressure chamber halves and in electrical contact with an electronic testing device, wherein each contact element is subdivided into a first contact element section passing through one of the pressure chamber halves and a second contact element section, which is distanced from the first contact element section and is arranged inside the cavity, an air-tight sealing board arranged inside the cavity and extending transversely over the contact elements and sealed peripherally from one of the pressure chamber halves, the first contact element sections being arranged on one side of the sealing board and the second contact element sections, lying opposite the first contact element sections, being arranged on the opposite side of the sealing board, and the first contact element sections being electrically connected to the opposite second contact element sections via conductive sections of the sealing board, and a component specific DUT board arranged inside the cavity between the second contact element sections and third contact element sections, which are distanced from the second contact element sections, and with which the contacts of the components can be brought in contact.

2. The device as claimed in claim 1, wherein at least the first contact element sections consist of contact pins which are resilient in their longitudinal direction.

3. The device as claimed in claim 1, wherein the third contact element sections consist of contact pins which are resilient in their longitudinal direction.

4. A system for testing integrated circuit devices having contacts, comprising:

a pressure test chamber comprising mateable first and second chamber portions that can be separated from one another, said first and second chamber portions when brought together into contact with one another tightly enclosing a cavity into which a device under test can be disposed;

plural contact elements extending into the cavity and contacting the contacts of a said device under test;

each of said plural contact elements having a first contact section that passes through said first chamber portion and a second contact section distanced from the first section and disposed within the cavity;

an airtight sealing board disposed within the cavity and sealed peripherally with at least one of the first and second chamber portions, the first contact section being disposed on a first side of the sealing board, the second contact section being disposed on a second side of the sealing board opposite the first side, the first contact section being electrically connected to the second contact section via conductive elements of the sealing board;

a third contact section disposed within the cavity and distanced from the second contact section; and a component specific device-under-test board disposed within the cavity between the second contact section and the third contact section, with which contacts of the device under test can be brought in contact.

* * * * *